(12) United States Patent
Ravi et al.

(10) Patent No.: US 7,553,694 B2
(45) Date of Patent: Jun. 30, 2009

(54) METHODS OF FORMING A HIGH CONDUCTIVITY DIAMOND FILM AND STRUCTURES FORMED THEREBY

(76) Inventors: Kramadhati V. Ravi, 89 Fairoaks La., Atherton, CA (US) 94027; Michael C. Garner, 2781 Camino Casa Buena, Pleasanton, CA (US) 94566

( * ) Notice: Subject to any disclaimer, the term of this patent is extended or adjusted under 35 U.S.C. 154(b) by 487 days.

(21) Appl. No.: 11/100,885

(22) Filed: Apr. 4, 2005

(65) Prior Publication Data
US 2005/0189544 A1    Sep. 1, 2005

Related U.S. Application Data

(62) Division of application No. 10/313,686, filed on Dec. 5, 2002.

(51) Int. Cl.
*H01L 21/00*  (2006.01)

(52) U.S. Cl. ................................. 438/105; 438/122

(58) Field of Classification Search ............ 438/105, 438/122
See application file for complete search history.

(56) References Cited

U.S. PATENT DOCUMENTS

| | | | |
|---|---|---|---|
| 4,259,090 A | | 3/1981 | Bovenkerk |
| 5,082,522 A | * | 1/1992 | Purdes et al. ............... 438/641 |
| 5,242,711 A | | 9/1993 | DeNatale et al. |
| 5,298,286 A | | 3/1994 | Yang et al. |
| 5,432,003 A | | 7/1995 | Plano et al. |
| 5,443,032 A | * | 8/1995 | Vichr et al. ................ 117/84 |
| 5,449,531 A | | 9/1995 | Zhu et al. |
| 5,474,808 A | | 12/1995 | Aslam |
| 5,478,513 A | | 12/1995 | Kosky et al. |
| 5,487,945 A | | 1/1996 | Yang et al. |
| 5,488,232 A | | 1/1996 | Glass et al. |
| 5,488,350 A | | 1/1996 | Aslam et al. |
| 5,501,877 A | | 3/1996 | Adair et al. |
| 5,541,423 A | | 7/1996 | Hirabayashi |
| 5,559,367 A | | 9/1996 | Cohen et al. |
| 5,607,723 A | | 3/1997 | Plano et al. |
| 5,614,019 A | | 3/1997 | Vichr et al. |
| 5,614,272 A | | 3/1997 | Shah |
| 5,654,044 A | | 8/1997 | Moran |
| 5,656,828 A | | 8/1997 | Zachai et al. |
| 5,674,355 A | | 10/1997 | Cohen et al. |

(Continued)

FOREIGN PATENT DOCUMENTS

JP    03115194 A  *  5/1991

(Continued)

OTHER PUBLICATIONS

U.S. Appl. No. 10/973,161, filed Oct. 25, 2004, inventor: Ravi. Office Action dated Aug. 8, 2006.

(Continued)

*Primary Examiner*—Laura M Menz
(74) *Attorney, Agent, or Firm*—Blakely, Sokoloff, Taylor & Zafman LLP

(57) ABSTRACT

A method of forming a high thermal conductivity diamond film and its associated structures comprising selectively nucleating a region of a substrate, and forming a diamond film on the substrate such that the diamond film has large grains, which are at least about 20 microns in size. Thus, the larger grained diamond film has greatly improved thermal management capabilities and improves the efficiency and speed of a microelectronic device.

16 Claims, 11 Drawing Sheets

U.S. PATENT DOCUMENTS

| | | | |
|---|---|---|---|
| 5,679,269 | A | 10/1997 | Cohen et al. |
| 5,683,939 | A | 11/1997 | Schrantz et al. |
| 5,686,152 | A * | 11/1997 | Johnson et al. ............. 427/577 |
| 5,733,369 | A * | 3/1998 | Yonehara et al. .............. 117/89 |
| 5,750,243 | A | 5/1998 | Shikata et al. |
| 5,795,653 | A | 8/1998 | Cuomo et al. |
| 5,812,362 | A | 9/1998 | Ravi |
| 5,843,224 | A | 12/1998 | Zachai et al. |
| 5,849,413 | A | 12/1998 | Zhu et al. |
| 5,853,478 | A | 12/1998 | Yonehara et al. |
| 5,855,954 | A | 1/1999 | Gutheit et al. |
| 5,891,575 | A | 4/1999 | Marchywka et al. |
| 5,939,140 | A | 8/1999 | Oji et al. |
| 6,082,200 | A | 7/2000 | Aslam et al. |
| 6,110,759 | A | 8/2000 | Konrad et al. |
| 6,126,855 | A | 10/2000 | Elliott |
| 6,329,674 | B1 | 12/2001 | Konrad et al. |
| 6,537,668 | B1 | 3/2003 | Vijayen et al. |
| 6,544,627 | B1 | 4/2003 | Vijayen et al. |
| 6,740,384 | B2 | 5/2004 | Veerasarny et al. |
| 6,770,966 | B2 | 8/2004 | Chrysler et al. |
| 6,783,589 | B2 | 8/2004 | Dahl et al. |
| 6,805,891 | B2 | 10/2004 | Vijayen et al. |
| 6,830,813 | B2 * | 12/2004 | Ravi ........................... 428/408 |
| 6,921,706 | B2 | 7/2005 | Chrysler et al. |
| 6,936,497 | B2 | 8/2005 | Ravi et al. |
| 6,987,028 | B2 | 1/2006 | Ravi |
| 7,170,098 | B2 | 1/2007 | Chrysler et al. |
| 2004/0108506 | A1 * | 6/2004 | Ravi et al. ................... 257/77 |
| 2004/0188262 | A1 | 9/2004 | Heimann et al. |
| 2004/0191534 | A1 | 9/2004 | Ravi |
| 2005/0017351 | A1 | 1/2005 | Ravi |
| 2005/0112793 | A1 * | 5/2005 | Ravi et al. ................... 438/105 |
| 2005/0189544 | A1 * | 9/2005 | Ravi et al. ................... 257/77 |

OTHER PUBLICATIONS

U.S. Appl. No. 10/313,686, filed Dec. 5, 2002; inventor: Kramadhati V. Ravi; Office Action dated Oct. 5, 2006.

Notice of Allowance from U.S. Appl. No. 10/313,686, mailed Sep. 19, 2007, 8 pgs.

Office Action from U.S. Appl. No. 10/313,686, mailed Jan. 29, 2007, 11 pgs.

Office Action from U.S. Appl. No. 10/313,686, mailed Nov. 29, 2005, 7 pgs.

Office Action from U.S. Appl. No. 10/313,686, mailed Jun. 14, 2005, 7 pgs.

Office Action from U.S. Appl. No. 10/313,686, mailed Dec. 27, 2004, 7 pgs.

Office Action from U.S. Appl. No. 10/313,686, mailed Jun. 14, 2006, 4 pgs.

Notice of Allowance from U.S. Appl. No. 10/313,686, mailed Nov. 29, 2007, 5 pgs.

Office Action from U.S. Appl. No. 10/973,161, mailed Aug. 22, 2007, 9 pgs.

Notice of Allowance from U.S. Appl. No. 10/973,161, mailed Nov. 28, 2008, 7 pgs.

Notice of Allowance from U.S. Appl. No. 10/973,161, mailed Apr. 2, 2008, 6 pgs.

* cited by examiner

METHODS OF FORMING A HIGH CONDUCTIVITY DIAMOND FILM AND STRUCTURES FORMED THEREBY

This U.S. Patent application is a divisional of U.S. patent application Ser. No. 10/313,686 filed Dec. 5, 2002.

FIELD OF THE INVENTION

The present invention relates to the field of semiconductor processing, and more particularly to methods of processing diamond layers for use in thermal management and structures formed thereby.

BACKGROUND OF THE INVENTION

One goal of microelectronic manufacturing is to increase the number of transistors on a device and thereby increase its operation speed. However, with increased transistor density and speed, power consumption is also increased dramatically. The heat generated from the increased power consumption can raise the microelectronic device temperature dramatically and degrade circuit performance and reliability. Therefore, reducing the overall device operation temperature is of great importance for optimum device performance.

Furthermore, operation of the transistors in a microelectronic device may cause non-uniform heating of the circuit. Certain points on the device may generate more heat than others, thus creating "hot spots". Without such hot spots, it may be possible to increase the average power dissipation of the device while maintaining a desired temperature of the integrated circuit, thus allowing it to operate at a higher frequency.

One way to reduce hot spots is to form a layer of diamond on a device substrate, since the high thermal conductivity of diamond enables a diamond layer to spread thermal energy laterally and thus greatly minimize the localized hot spots on the device. However, there are problems associated with forming a diamond layer. Previously proposed diamond films typically exhibit numerous small grains 304 (i.e. the initial nucleation structure of the diamond film on the substrate 302), due to profuse nucleation during the initial stages of diamond growth (See FIG. 3). Large grains 306 eventually form with continued diamond growth, but the thermal conductivity of the diamond film is dictated by the more numerous, inhomogeneous small grains 304, which have a lower thermal conductivity than the large grains 306. The proliferation of small grains, whose size is on the order of 10 microns, leads to a reduction of thermal conductivity below that of single crystal diamond (2,000 W/m-K). The lower thermal conductivity of small-grain dominated diamond films in turn minimizes the small-grained films effectiveness in reducing hot spots across the device.

Accordingly, there is a need for improved methods of diamond fabrication and structures formed thereby that increase the thermal conductivity of a diamond film and thereby improve its thermal management capabilities. The present invention provides such methods and structures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
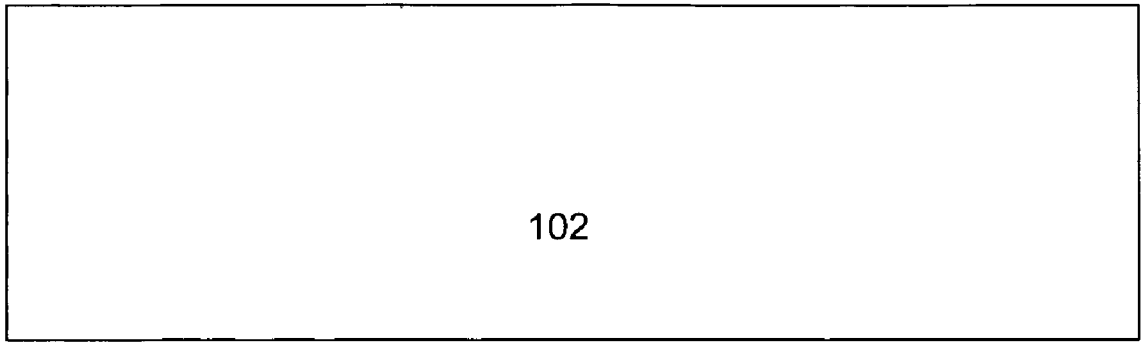
FIGS. 1*a*-1*f* represent cross-sections of structures that may be formed when carrying out an embodiment of the method of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a high conductivity diamond film and its associated structures are described. Those methods comprise selectively nucleating diamond on a region of a substrate and then forming a diamond film on the substrate such that the diamond film has large grains, which are about 20 microns in size. Because the thermal conductivity of a diamond film is a function of its grain size, a larger grained diamond film has greatly improved thermal management capabilities, and thus can serve to improve the efficiency and speed of a microelectronic device.

Figure 1B:
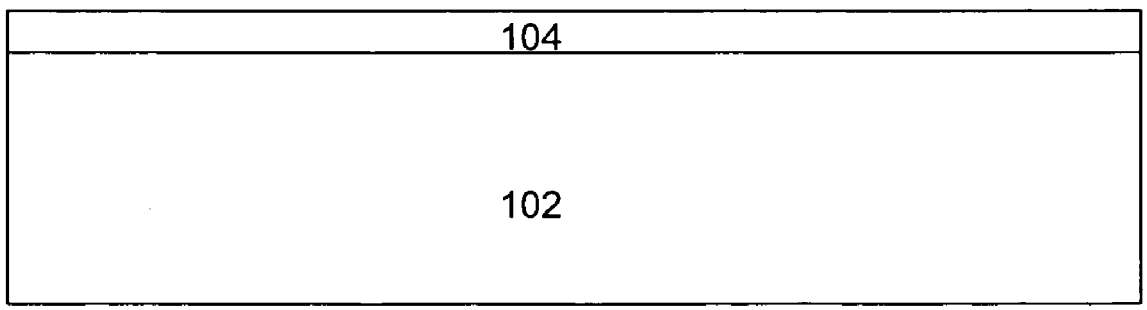

In one embodiment of the method of the present invention, as illustrated by FIGS. 1*a*-1*f*, an abraded (roughened) layer 104 is formed on a substrate 102 (FIGS. 1*a*-1*b*). The substrate 102 may comprise materials such as silicon, silicon-on insulator, germanium, indium antimonide, lead telluride, indium arsenide, indium phosphide, gallium arsenide, or gallium antimonide. Although several examples of materials from which the substrate 102 may be formed are described here, any material that may serve as a foundation upon which a microelectronic device may be built falls within the spirit and scope of the present invention.

It is well known by those skilled in the art that a diamond film requires an abraded, or roughened surface for nucleation on an otherwise undamaged substrate. By way of illustration and not limitation, suitable abrasive materials which can be used to abrade the substrate 102 and thus form the abraded layer 104 may include silicon carbide particulates as well as diamond particulates. Although a few examples of materials that may be used to abrade the substrate 102 and thus form the abrased layer 104 are described here, the substrate 102 may be abraded with other materials that serve to prepare the substrate 102 for the nucleation (initial stage of diamond film growth wherein individual grains are formed) of a diamond film.

The abraded layer 104 may be formed on the substrate 102 using a variety of methods known in the art, e.g. performing a mechanically abrasive step such as sanding the substrate 102, or immersing the substrate 102 in an ultrasonic bath which contains a suspension of an abrasive material.

Figure 1C:
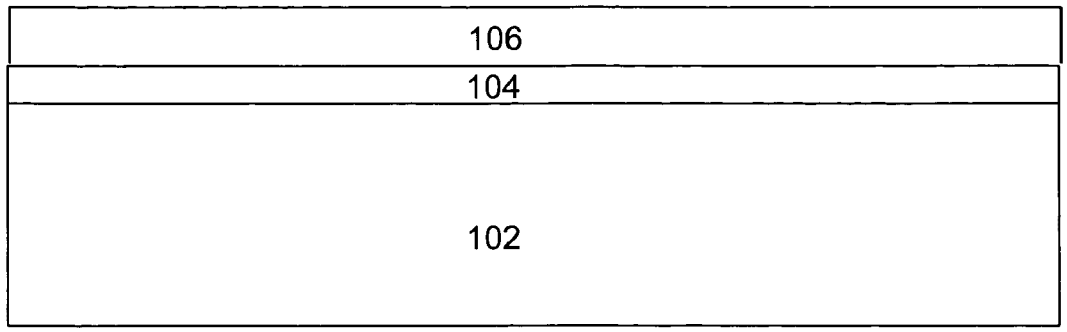

Following the formation of the abraded layer 104, a dielectric layer 106 is deposited onto the abraded layer 104 (FIG. 1*c*). Those skilled in the art will appreciate that the dielectric layer 106 may be formed using a variety of materials, such as silicon nitride or silicon dioxide. Although a few examples of materials that may be used to form the dielectric layer 106 are described here, that layer may be made from other materials that serve to prevent the formation of a diamond film on the substrate 102. By way of illustration and not limitation, the dielectric layer 106 may be deposited using conventional techniques such as physical vapor deposition ("PVD"), atomic layer deposition ("ALD"), conventional chemical vapor deposition ("CVD"), low pressure CVD, plasma enhanced CVD or other such methods known to those skilled in the art.

The dielectric layer 106 is preferably less than 1 micron thick, but must be thick enough to avoid pinholes in the dielectric layer 106, which could contribute undesired nucleation sites by exposing the underlying abraded layer 104 through the pinholes in the dielectric layer 106. The dielectric layer 106 must also be sufficiently thin so that it does not impede the subsequent growth of the diamond grains following the nucleation phase of a diamond film, since a thinner diamond film is more desired in terms of cost and efficiency.

Figure 1D:
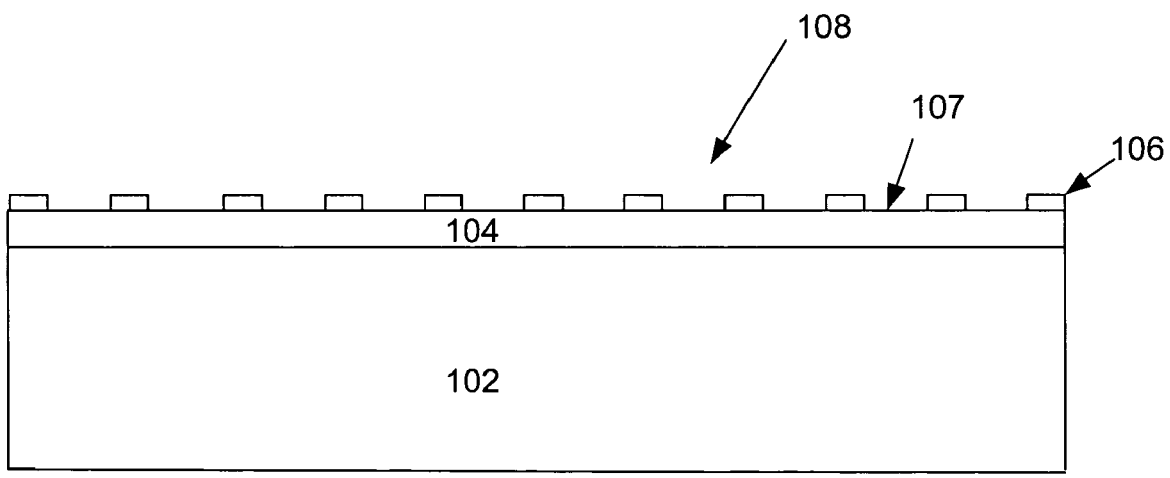

A plurality of openings 108 are then formed in the dielectric layer 106 (FIG. 1*d*). The openings 108 define a plurality of nucleation sites 107, which are the exposed portions of the underlying abraded layer 104. The openings 108 may be formed using conventional lithographic techniques, which are well known to those skilled in the art and consequently will not be fully described herein. The openings 108, which can be of any geometric shape (such as circular, square, triangular, or any appropriately shaped geometry), are preferably about 1 micron or less in size, (preferably 1 micron) and are spaced less than about 50 percent of the final desired thickness of the diamond film, most preferably about 10 to 20 microns apart. It is to be understood that the spacing of the openings 108 depends on such factors as the desired final thickness and thermal conductivity of the diamond film. The spacing between the openings 108 determines the ultimate size and uniformity of the individual diamond grains that form after the initial nucleation stage of the diamond film, as the diamond film continues to grow and the individual grains coalesce.

Figure 1E:
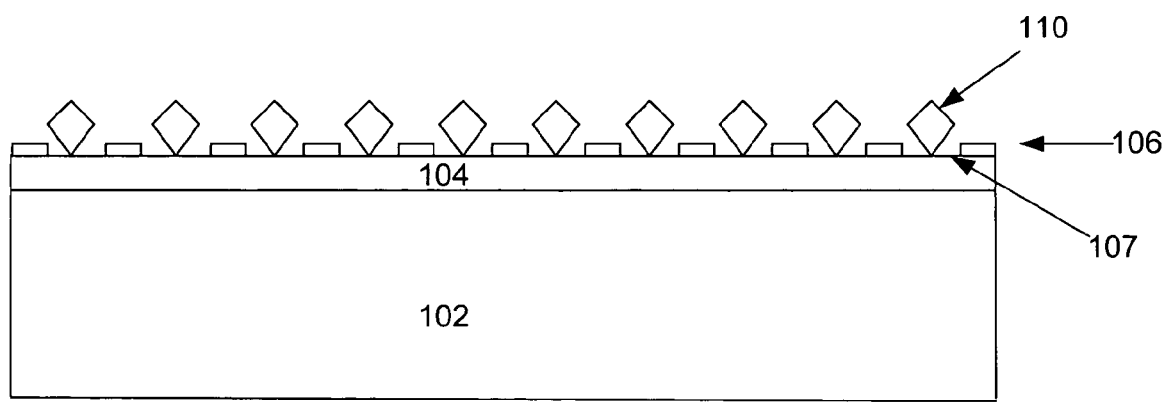
Figure 1F:
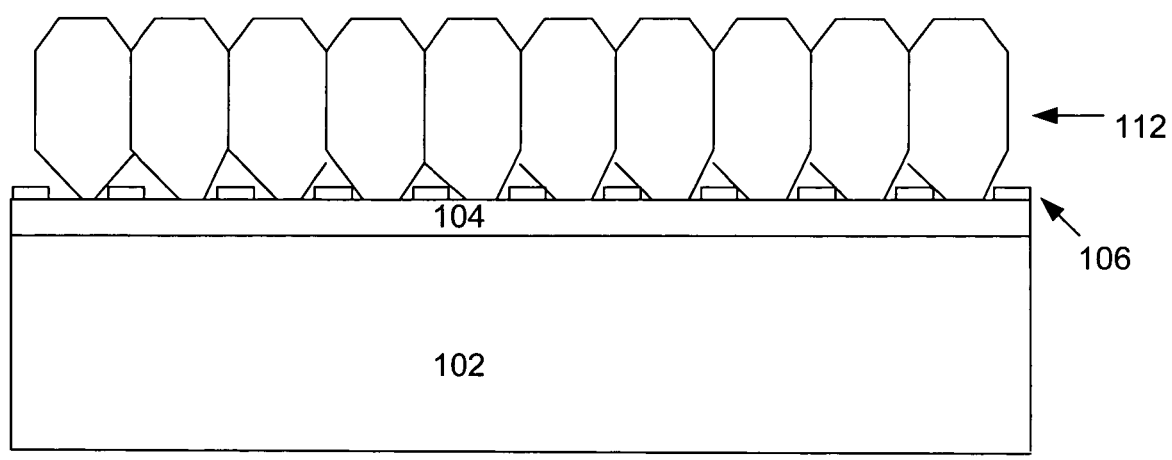
Figure 3:
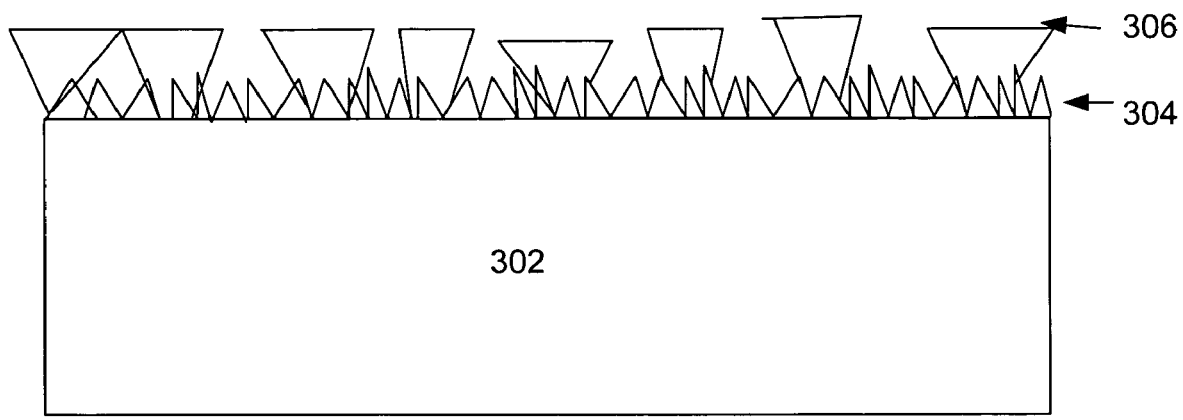
FIG. 3 is a cross-sectional illustration of a diamond film structure, as is known in the art.

Next, a plurality of diamond grains 110 are formed on the nucleation sites 107, but do not form on the dielectric layer 106 (FIG. 1*e*). The diamond grains 110 may be formed on the nucleation sites 107 utilizing conventional methods suitable for the deposition of diamond films known in the art, such as plasma enhanced chemical vapor deposition ("PECVD") (preferred). The preferred process pressure is in a range from about 10 to 100 Torr, with 40 to 50 Torr most preferred, a temperature of about 600 to 900 degrees, with 800 to 900 most preferred, and a power between about 10 kW to about 200 kW. Methods of plasma generation may include microwave, RF, DC glow and DC arc-jet. Gases such as $CH_4$, $C_2H_2$, fullerenes or solid carbon gas precursors mixed with a super saturation of hydrogen at 10 to 200 sccm flow rate may be used, while the preferred gas mix is $CH_4$ and $H_2$ in a ratio of 0.5 to 6% $CH_4$ and 99.4 to 94% $H_2$. The diamond grains 110 are selectively nucleated, i.e. the nucleation sites 107 are confined to the areas created by the openings 108 in the dielectric layer 106. Thus, continued growth of the diamond grains 110 results in diamond grains 110 that are much larger and more uniform (see FIG. 1*f*) than would be obtained by non-selective nucleation, since the selectively nucleated diamond grains 110 can grow to a larger size before encountering an adjacent diamond grain 110 as compared with diamond films grown in a non-selective nucleation process (see FIG. 3). The diamond grains 110 of the present invention can range from 10-20 microns, and are preferably larger than 20 microns, which approaches the grain size of a single crystal diamond. Consequently, the thermal conductivity of the larger diamond grains 110 approaches that of single crystal diamond (about 2000 W/m-K), and can range from about 600 to above 2000 W/m-K, with greater than 1000 W/m-k preferred.

The diamond grains 110 continue to grow and coalesce until the desired thickness of the diamond layer 112 is achieved. The diamond layer 112 may be between about 25 and 200 microns thick, most preferably 100 microns thick. A thinner diamond layer 112 is preferred, since they are less expensive to fabricate and easier to integrate into a microelectronic device. The diamond layer 112 has a thermal conductivity of about 600 to above 2000 W/m-K, with greater than 1000 W/m-k preferred.

Thus, the present invention provides methods and structures formed thereby of forming a thin diamond layer 112 with uniformly large grains that also exhibits high thermal conductivity.

Figure 2A:
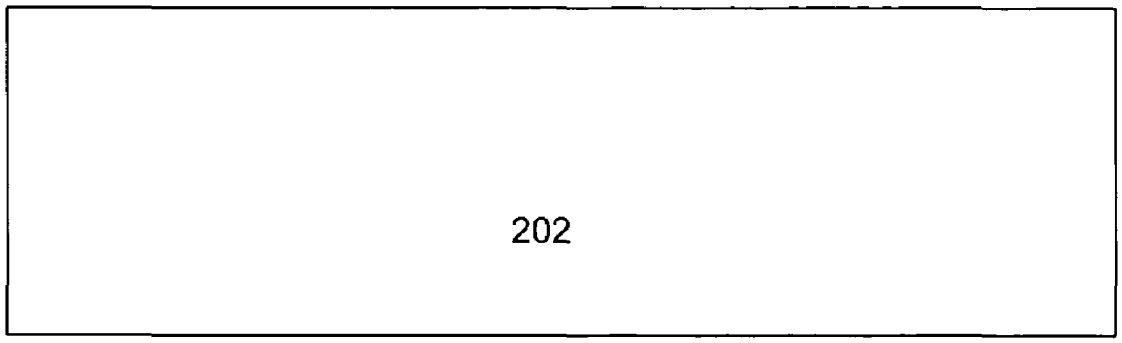
FIG. 2*a-h* represent cross-sections of a structure that may be formed when carrying out another embodiment of the method of the present invention.
Figure 2B:
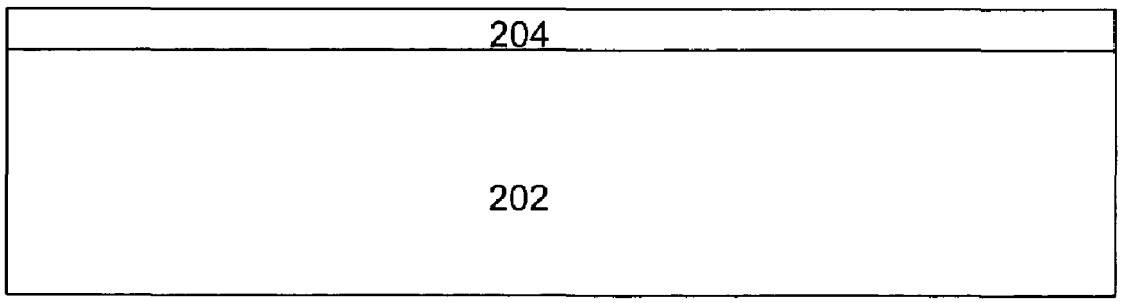

In another embodiment of the present invention (FIG. 2*a*-2*f*), an abraded layer 204 is formed on a substrate 202 (FIGS. 2*a*-2*b*), as has been previously described herein (see FIGS. 1*a*-1*b*).

Figure 2C:
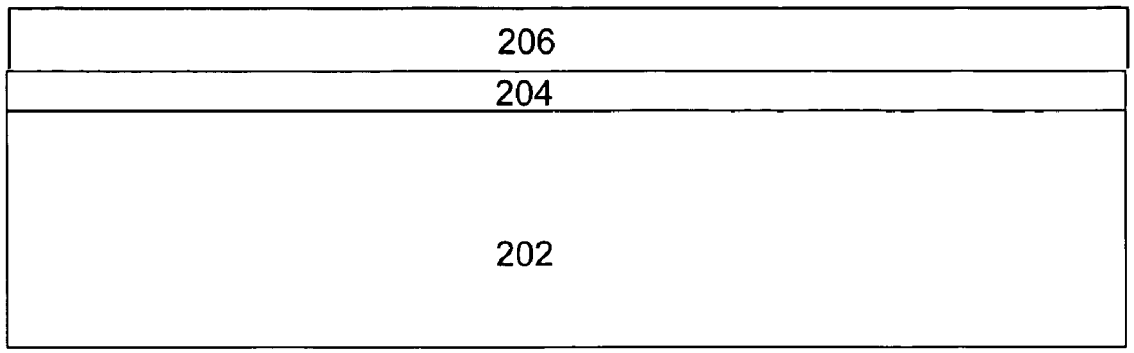

Following the formation of the abraded layer 204, a masking layer 206 is deposited onto the abraded layer 204 (FIG. 2*c*). Those skilled in the art will appreciate that the masking layer 206 may be formed from a variety of materials, such as photoresist. Although an example of materials that may be used to form the masking layer 206 are described here, that layer may be made from other materials that serve to prevent the polishing of the substrate 102. The masking layer 206 may be deposited using conventional techniques which are well known in the art, and will not be described herein.

Figure 2D:
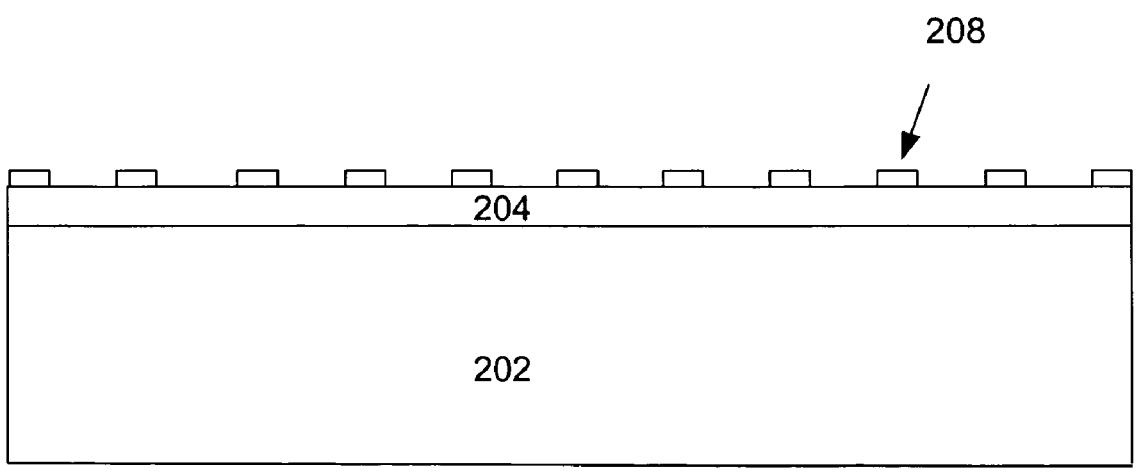

A plurality of masked areas 208 are then formed from the masking layer 206 using conventional photolithographic techniques known in the art that will not be described herein (FIG. 2*d*). The masked areas 208, which can be of any geometric shape, are preferably about 1 micron or less in size, (preferably 1 micron) and are spaced less than about 50 percent of the final desired thickness of the diamond film, most preferably about 5 to 20 microns apart. It is to be understood that the spacing of the masked areas 208 depends on such factors as the desired final thickness and thermal conductivity of the diamond film. The spacing between the masked areas 208 determines the ultimate size and uniformity of the individual diamond grains that form after the initial nucleation stage of the diamond film, as the diamond film continues to grow and the individual grains coalesce.

Figure 2E:
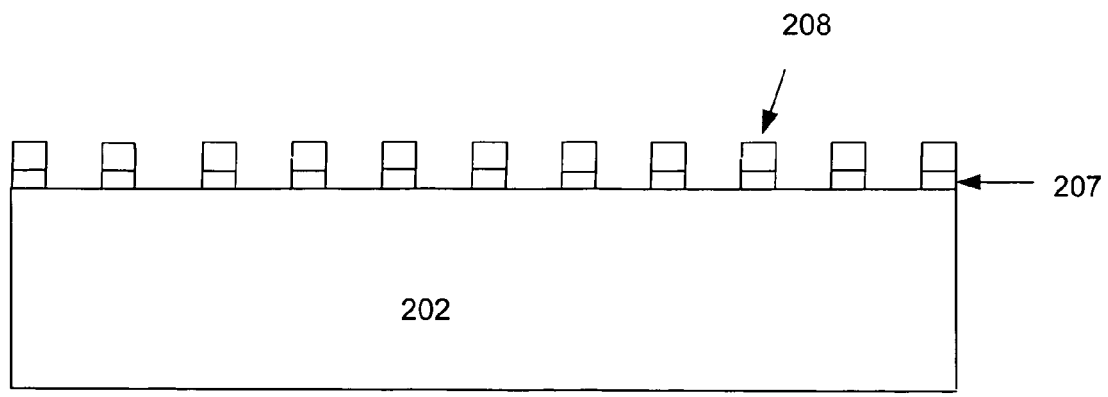
Figure 2F:
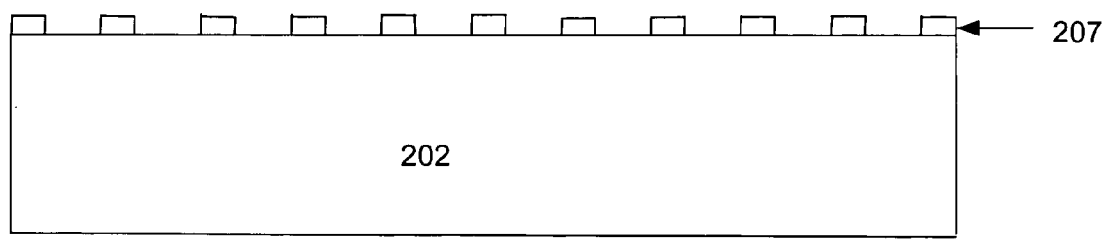

The abraded layer 204 is then etched using conventional techniques known in the art (not described herein) to remove the surface damage (caused from the abrasion of the substrate 202) in all areas except those areas protected by the masking areas 208 (FIG. 2*e*). The etching of the abraded layer 204 defines a plurality of nucleation sites 207 underneath the masking areas 208. The nucleation sites 207 are then exposed after the masking areas 208 are subsequently removed using conventional photolithographic techniques (FIG. 2f).

Figure 2G:
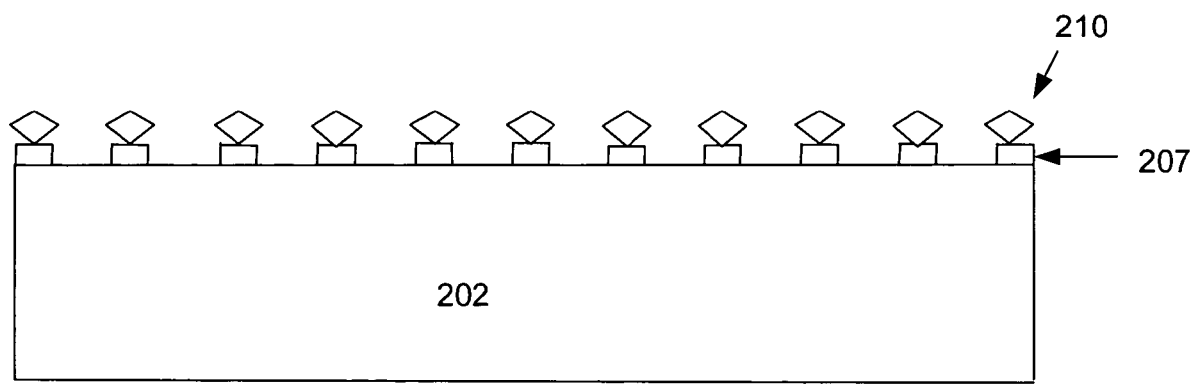

Next, a plurality of diamond grains 210 are formed on the nucleation sites 207, but do not form on the substrate 202 (FIG. 2g). The diamond grains 210 may be deposited using the same methods as the earlier described embodiment of the present invention. The diamond grains 210 are selectively nucleated, ie. the diamond grains grow only on the nucleation sites 207. Thus, continued growth of the diamond grains 210 results in diamond layer 212 having diamond grains 210 that are much larger and more uniform (see FIG. 2h) than would be obtained by non-selective nucleation, since the selectively nucleated diamond grains 210 can grow to a larger size before encountering an adjacent diamond grain 210 as compared with diamond films grown in a non-selective nucleation process (see FIG. 3). The diamond grains 210 of the present invention can range from 10-20 microns, and are preferably larger than 20 microns, which approaches the grain size of a single crystal diamond. Consequently, the thermal conductivity of the larger diamond grains 110 approaches that of single crystal diamond (about 2000 W/m-K).

Figure 2H:
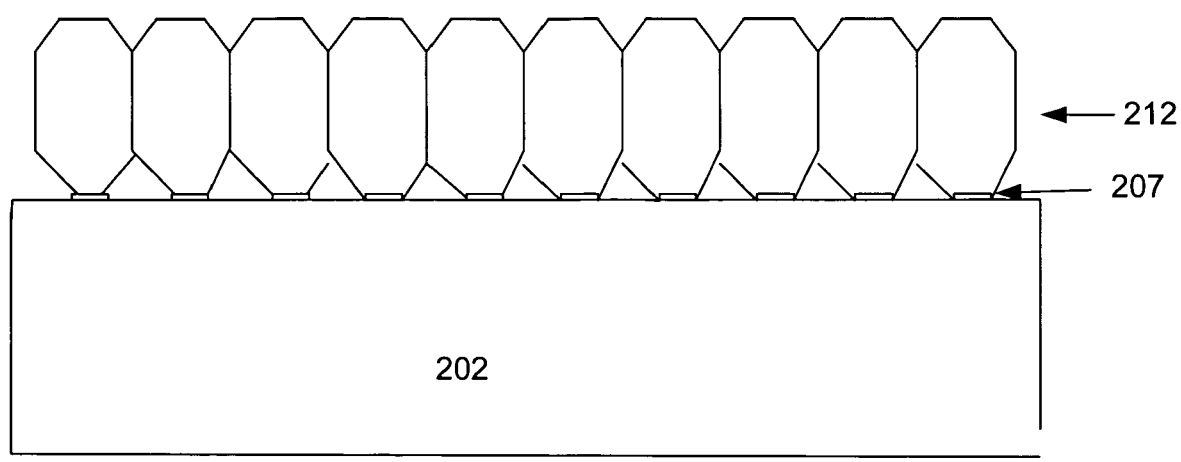

The diamond grains 210 continue to grow and coalesce until the desired thickness of the diamond layer 212 is achieved (FIG. 2h). The diamond layer 212 may be between about 25 and 200 microns thick, and is most preferably 100 microns thick. The diamond layer 212 has a thermal conductivity of about 600 to above 2000 W/m-K, with greater than 1000 W/m-k preferred.

Figure 4:
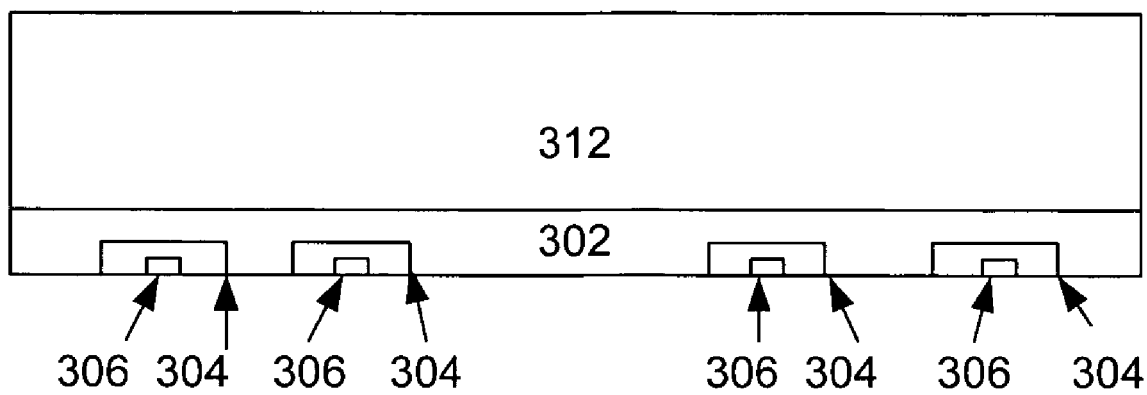
FIG. 4 represents a cross-section of a structure that may be formed when carrying out another embodiment of the present invention.

In yet another embodiment (see FIG. 4), a diamond layer 312, which is formed according to the methods of the present invention, may be attached to a substrate 302 (as previously described herein), wherein the substrate contains a plurality of integrated circuits 304, which may comprise various circuit elements such as, by way of illustration and not limitation, a plurality of transistors 306. The substrate 302 may further be ground or polished to a thickness of about 1 to 3 microns thick. The diamond layer 312 may be attached by various methods as are known in the art, such as by depositing the diamond layer 312 by PECVD onto the substrate 302, or by bonding the substrate 302 to the diamond layer 312. Thus the diamond layer 312 may serve to provide a mechanism by which thermal hot spots on the integrated circuit 304 are greatly reduced, which in turn increases the speed and reliability of the integrated circuit 304.

As described above, the present invention provides methods and structures formed thereby of selectively nucleating a substrate in order to promote the growth of large grained diamond films which have a high thermal conductivity. This increase in the thermal conductivity greatly improves the ability of a diamond film to thermally manage a microelectronic device, such as in the thermal management of hot spots across a device. Thus the reliability and speed of a microelectronic device are greatly enhanced.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture a silicon device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method of forming a diamond layer comprising:
    forming an abraded layer on a substrate;
    forming a dielectric layer on the abraded layer;
    forming a plurality of openings in the dielectric layer; and
    forming a diamond layer on the plurality of openings, wherein the openings are about 1 micron or less in size.

2. The method of claim 1 wherein the openings are spaced between about 5 to 20 microns apart.

3. The method of claim 1 wherein the thermal conductivity of the diamond layer is about 2000 W/m-K.

4. The method of claim 1 wherein the diamond layer comprises diamond grains.

5. The method of claim 4 wherein the diamond grains are greater than about 10 microns in size.

6. The method of claim 1 wherein the diamond layer is between about 25 and 200 microns thick.

7. A method of forming a diamond layer comprising:
    forming an abraded layer on a substrate;
    forming a dielectric layer on the abraded layer;
    forming a plurality of openings in the dielectric layer;
    forming a diamond layer on the plurality of openings, wherein the openings are spaced between about 5 to 20 microns apart.

8. The method of claim 7 wherein the thermal conductivity of the diamond layer is about 2000 W/m-K.

9. The method of claim 7 wherein the diamond layer comprises diamond grains.

10. The method of claim 7 wherein the diamond grains are greater than about 10 microns in size.

11. The method of claim 7 wherein the diamond layer is between about 25 and 200 microns thick.

12. A method of forming a diamond layer comprising:
    forming an abraded layer on a substrate;
    forming a dielectric layer on the abraded layer;
    forming a plurality of openings in the dielectric layer; and
    forming a diamond layer on the plurality of openings, wherein the diamond layer is between about 25 and 200 microns thick.

13. The method of claim 12 wherein the openings are spaced between about 5 to 20 microns apart.

14. The method of claim 12 wherein the thermal conductivity of the diamond layer is about 2000 W/m-K.

15. The method of claim 12 wherein the diamond layer comprises diamond grains.

16. The method of claim 12 wherein the diamond grains are greater than about 10 microns in size.

* * * * *